(12) United States Patent
Xue et al.

(10) Patent No.: US 7,898,296 B1
(45) Date of Patent: Mar. 1, 2011

(54) DISTRIBUTION AND SYNCHRONIZATION OF A DIVIDED CLOCK SIGNAL

(75) Inventors: Ning Xue, Fremont, CA (US); Philip Clarke, Leatherhead (GB); Joseph Huang, Morgan Hill, CA (US); Yan Chong, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/624,281

(22) Filed: Nov. 23, 2009

Related U.S. Application Data

(62) Division of application No. 11/895,594, filed on Aug. 24, 2007, now Pat. No. 7,642,812.

(51) Int. Cl.
*H03K 19/00* (2006.01)
(52) U.S. Cl. .......................................... 326/93
(58) Field of Classification Search ............... 326/37–41, 326/47, 101, 93
See application file for complete search history.

(56) References Cited

U.S. PATENT DOCUMENTS

| | | | |
|---|---|---|---|
| 5,557,649 A * | 9/1996 | Scheckel et al. | 377/48 |
| 6,566,918 B1 * | 5/2003 | Nguyen | 327/115 |
| 6,993,671 B2 | 1/2006 | Pricer et al. | |
| 6,996,736 B1 | 2/2006 | Nguyen et al. | |
| 7,228,451 B1 | 6/2007 | Nguyen et al. | |

* cited by examiner

*Primary Examiner* — Rexford N Barnie
*Assistant Examiner* — Thienvu V Tran
(74) *Attorney, Agent, or Firm* — Mauriel Kapouytian & Treffert LLP; Michael Mauriel

(57) ABSTRACT

Methods and circuitry for distributing and synchronizing a divided clock signal in an electronic device are disclosed. In one aspect of an embodiment, a series of registers distributes the divided clock signal and the series of registers is clocked by a full-speed clock signal from which the divided clock signal is derived. In another aspect, the divided clock signal and the full-speed clock signal are distributed to IO circuitry of the electronic device. In yet another aspect, the divided clock signal is also distributed to circuitry in a core of the electronic device.

7 Claims, 6 Drawing Sheets

US 7,898,296 B1

DISTRIBUTION AND SYNCHRONIZATION OF A DIVIDED CLOCK SIGNAL

CROSS REFERENCE TO RELATED APPLICATION

This application is a Divisional of U.S. application Ser. No. 11/895,594, filed Aug. 24, 2007, hereby incorporated by reference.

BACKGROUND

The present invention relates to the distribution of clock signals generally and divided clock signals in particular.

Electronic devices, including programmable logic devices ("PLDs") and other devices, often must interface with a variety of other devices. To the extent that the clock speed of a device's core and the data interfaces with which it must interact are substantially similar, the clock signal that runs the input/output ("IO") circuits of the device can be at the same speed as the clock signal that runs the core circuits of the device. However, there is increasingly a need for PLDs to interact with data interfaces that have a higher clock speed than the maximum clock speed ("Fmax") of the PLD core circuitry. To accomplish receiving off-chip data (and outputting data off-chip) at clock speeds higher than Fmax, it is necessary to run a portion of the periphery circuitry at one clock speed for interacting with the IO pins and run another portion of the periphery circuitry at a slower clock speed for interacting with the core. Therefore, there is a need to distribute two clock signals that have different frequencies to circuitry in the periphery.

Synchronization is a basic issue that clock signal distribution networks must address. Specifically, the challenge is to distribute a clock signal from a common source to dispersed areas of a chip while accounting for distribution delays so that the clock signal has substantially the same phase everywhere on the chip that it is distributed. Two known techniques for synchronous clock distribution include equal-branch-length clock trees and delay compensated clock networks. Equal-branch clock trees distribute the clock signal at branch endpoints that are substantially the same distance from the clock source, thus the propagation delay at the distribution points is substantially equal (and therefore the clock signal is substantially synchronized across the distribution points). Delay-compensated networks use delay chains to allow using different length distribution lines. Such networks have delay chains (including one or more delay elements) and compensate for the difference in route lengths by adding more delay elements on shorter length routes to even out the propagation delay at different distribution points.

However, both types of clock distribution networks are resource intensive. Delay-compensated networks have the additional disadvantage that the amount of delay imparted by individual delay elements can be affected by process, voltage and temperature ("PVT") variations that make it even more difficult to achieve wide distribution of a synchronized clock signal. Therefore, if distribution of two different-speed clock signals is necessary, it is preferable to find a way of distributing a second clock signal in the periphery that does not require building an additional clock network using typical methods presently found in the art.

SUMMARY

An embodiment of the present invention provides a clock signal network for distributing and synchronizing a divided clock signal in an electronic device. In one aspect, a series of registers distributes the divided clock signal and the series of registers is clocked by a full-speed clock signal from which the divided clock signal is derived. In another aspect, the divided clock signal and the full-speed clock signal are distributed to IO circuitry of the electronic device. In yet another aspect, the divided clock signal is also distributed to circuitry in a core of the electronic device.

BRIEF DESCRIPTION OF THE DRAWINGS

The novel features of the invention are set forth in the appended claims. However, for purpose of explanation, several aspects of particular embodiments of the invention are described by reference to the following figures.

DETAILED DESCRIPTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
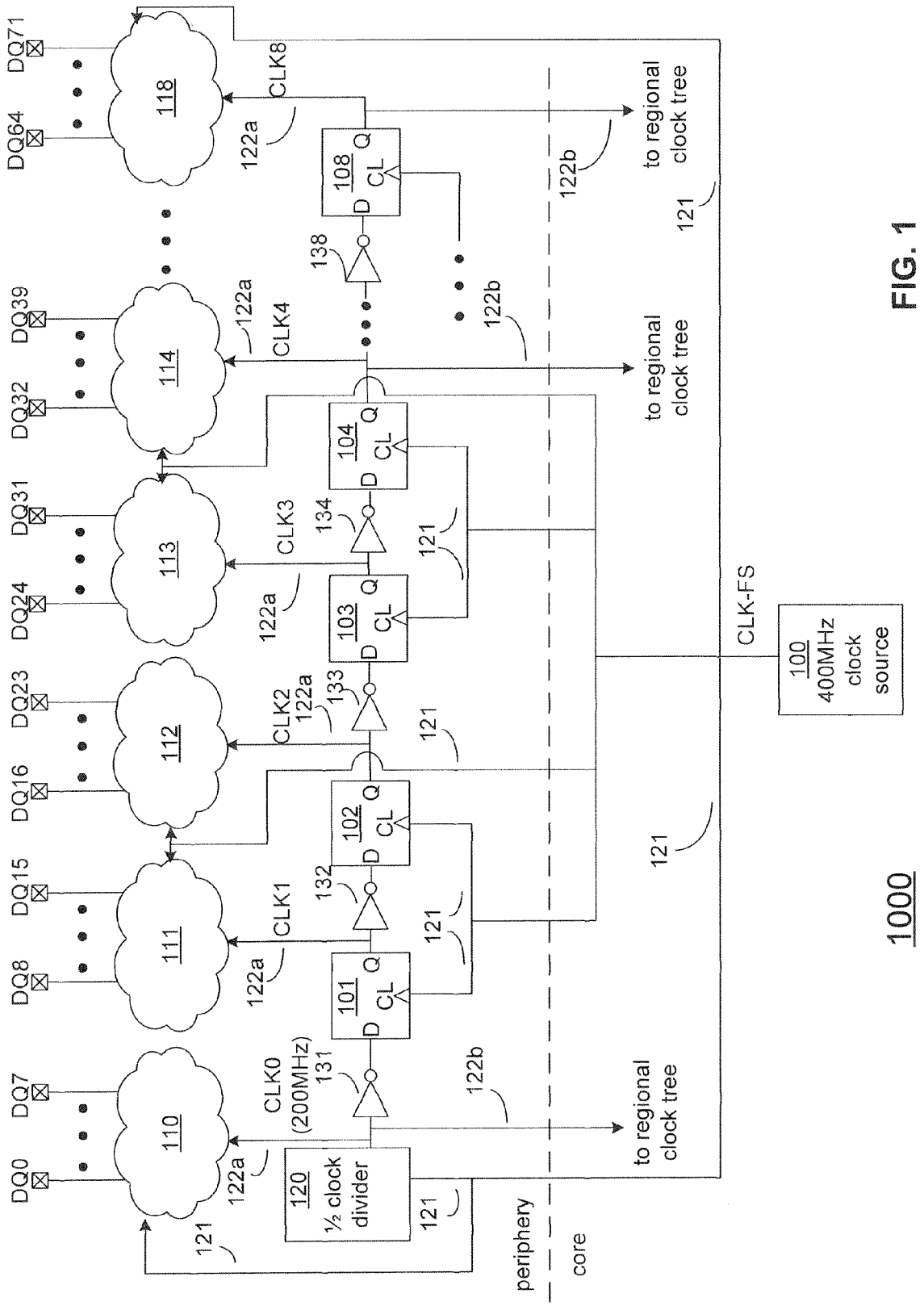
FIG. 1 illustrates an electronic device portion including a clock signal distribution network in accordance with an embodiment of the present invention.

FIG. 1 illustrates an electronic device portion 1000 including a clock distribution network in accordance with an embodiment of the present invention.

Referring to the operation of the illustrated elements of portion 1000, clock source 100 generates a full-speed clock signal CLK-FS in a core portion of the electronic device. A global clock tree comprising lines 121 distributes full-speed clock signal CLK-FS (having a frequency of 400 MHz in this example) to IO circuits 110, 111, 112, 113, 114, and 118, to clock divider 120, and to the clock inputs of registers in a series of registers including registers 101, 102, 103, 104, and 108.

Clock divider 120 is a "divide-by-two" clock divider and it derives a divided clock signal CLK0 (having a frequency of 200 MHz in this example). Divided clock signal CLK0 is provided to IO circuitry 110 via a line 122a as shown. Signal CLK0 is also inverted by inverter 131 and provided to a data input of register 101. Register 101 is a first register in a series of registers distributing the divided clock signal from divided clock signal source 120 (which, in one implementation, is also a register element coupled to divide full-speed clock signal CLK-FS; however, for descriptive purposes herein, divided clock source 120 is referred to separately from the series of additional registers distributing the divided clock signal). In this example, register 101 is a simple flip-flop including a data input "D", a clock input "CL" and a data output "Q." When the signal at register 101's input CL transitions from low to high, register 101 provides the signal value at its input D (e.g., either a low or high value) to its output Q. Registers 102, 103, 104, and 108 all operate in similar fashion. Register 101's data output is provided as clock signal CLK1 via a line 122a to IO circuitry 111. Register 101's output is also inverted by inverter 132 and provided to the data input of register 102, the next succeeding register in the series of registers. In similar fashion, register 102's output is provided as clock signal CLK2 via a line 122a to IO circuitry 112 and register 102's output is also inverted by inverter 133 and provided to the data input of register 103, the next succeeding register in the series of registers. Similarly, register 103's output is provided as clock signal CLK3 via a line 122a to IO circuitry 113 and register 103's output is also inverted by inverter 134 and provided to the data input of register 104, the next succeeding register in the series of registers. Register 104's output is provided as CLK4 via a line 122a to IO circuitry 114 and it is also provided inverted (via an inverter, not separately shown) to the next register in the series (not separately shown). In this example, register 108 is the last register in the series of registers forming the illustrated divided clock signal distribution network. Register 108's data input receives inverted output from a prior register in the series (not separately shown) via inverter 138. Register 108's output is provided as clock signal CLK8 via a line 122a to IO circuitry 118.

Those skilled in the art will appreciate that, in alternative illustrations, registers might be represented that have two data outputs rather than one, the second data output providing signals that are the inverted complementary signals of the first data output. For example, another flip flop illustration might show a Q and a Q' output, with Q' simply providing output inverted relative to that provided at Q. For purposes of the present illustration, such a register would be considered effectively the same as the combination of a register and an inverter illustrated herein. For example, register 101 and inverter 132, whose outputs are coupled respectively to IO circuitry 111 and to the data input of register 102, might be replaced so as to not illustrate the inverter separately, e.g., simply showing a register with a Q input coupled to IO circuitry 111 and a Q' output coupled to the data input of register 102.

The IO circuits control respective IO pin groups (with the pin number labels here simply corresponding to the pins selected for the interface in this particular example). Specifically, IO circuitry 110 controls eight pins, DQ0-DQ07 (individual pins between DQ0 and DQ7 not separately shown). Similarly, each of IO circuitry 111, 112, 113, 114, and 118 controls, respective pin groups (each group having eight pins): DQ8-DQ15, DQ16-DQ23, DQ24-DQ31, DQ32-DQ39, and DQ64-DQ71 (intervening IO circuitry between IO circuitry 114 and IO circuitry 118 and corresponding pin groups are not separately shown).

The IO circuits interact with the interface at the pins but also interact with other circuitry more internal to the chip which are running at a slower clock speed. Therefore, each set of IO circuitry includes some elements (not separately shown) clocked at the speed of full-speed clock signal CLK-FS and some elements (not separately shown) clocked at the speed of a divided clock signal that has ½ the frequency of CLK-FS. Therefore, as shown, both full-speed clock signal CLK-FS, and a divided clock signal is distributed to each IO circuit. Specifically, CLK-FS is distributed over lines 121 to each of IO circuitry 110, 111, 112, 113, 114, and 118 which each also receive a divided clock signal via lines 122a (respectively, divided clocks CLK0, CLK1, CLK2, CLK3, CLK4, and CLK8).

For purposes herein, "destination" circuitry may be considered to be any circuitry which uses the clock signal to perform any function of the electronic device such as, for example, circuitry in the periphery (e.g., the illustrated IO circuits) or circuitry in the core of the device. In the illustrated example, additional lines, lines 122b are provided to distribute divided clock signals to regional clock trees for distribution to the core. For purposes of not overcomplicating the drawings, this distribution of the divided clock signals to core clock trees is only shown with respect to the outputs of clock divider 120, register 104, and register 108.

The illustrated portion 1000 shows circuitry distributing a divided clock signal across IO circuits corresponding to a 72-pin interface (i.e., no DQ0-DQ71) The number of pins is just exemplary, however it does correspond to the Double Data Rate III ("DDR3") interface requirements. In alternative embodiments, a divided clock signal from a single divided clock signal source such as source 120 can be distributed over a smaller or larger number of IO circuits using the illustrated approach. For applications in which it is not known in advance which pins a PLD user will want to select for a particular interface, it may be preferable to provide in advance the capability of synchronously distributing a divided clock signal throughout a PLD's periphery. In a particular implementation, additional divided clock signal sources can be implemented around the chip (for example, one for every 72-pin interface) along with, for each divided clock signal source, a series of registers (with corresponding inverters or inverting outputs) clocked by a synchronously distributed full-speed clock signal, the series of registers synchronously distributing the divided clock signal to certain IO circuits in the periphery. However, it is not necessarily required to have multiple divided clock sources to cover the entire periphery. It is possible to use a single clock source and distribute it synchronously around the entire periphery using the principles of the example illustrated in FIG. 1.

Figure 2:
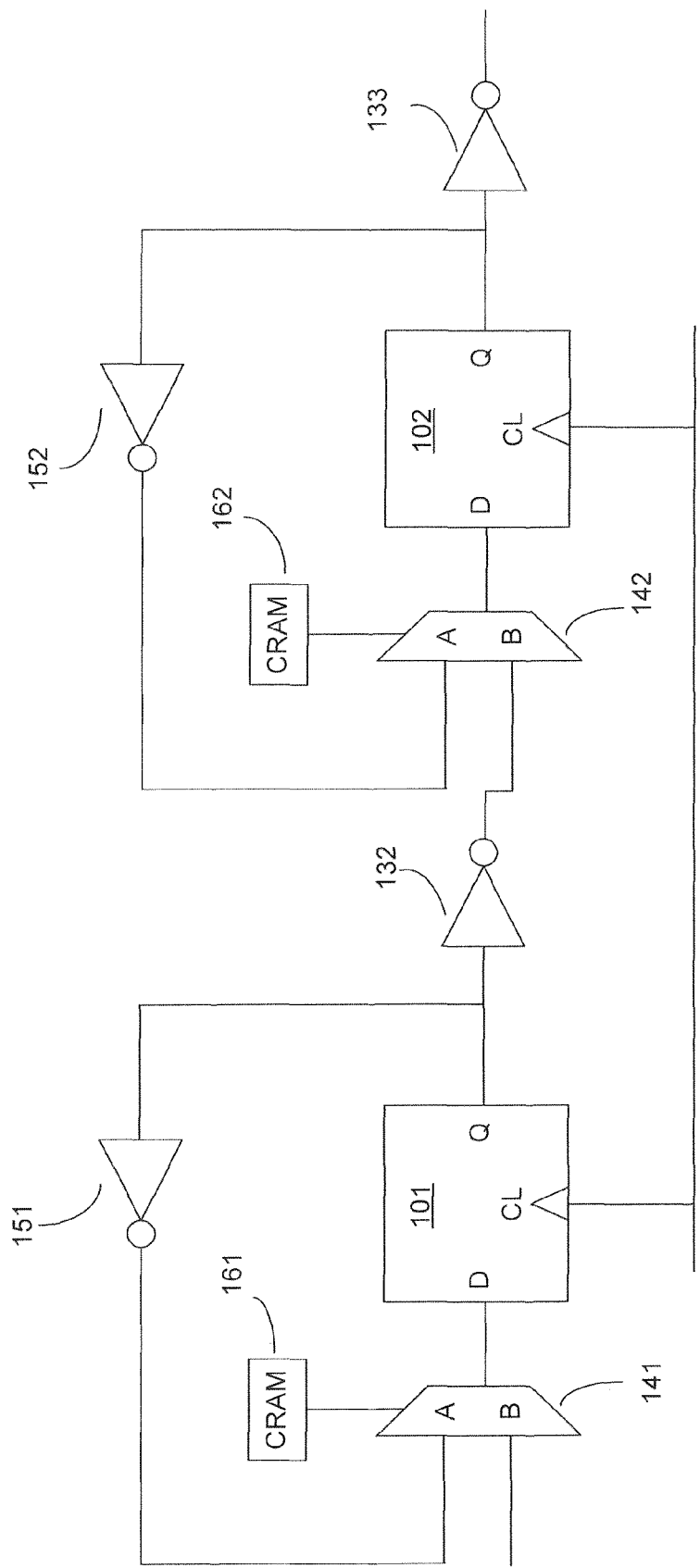
FIG. 2 illustrates further details of the embodiment of FIG. 1.

FIG. 2 illustrates further details of the exemplary embodiment illustrated in FIG. 1. As one skilled in the art may appreciate, a divided clock source such as clock divider 120 can be implemented with a simple flip flop similar to those used to implement registers 101, 102, 103, 104, and 108. By inverting the output of a flip flop and feeding the inverted output back to the flip-flop's input, the data output "Q" can provide a clock signal with one half the frequency of the clock signal fed into the clock input "CL." To provide a user with more flexibility in the placement of the divided clock source, the presently illustrated embodiment includes configurable circuitry to allow any register in the series of divided clock signal distribution registers to be configurable to serve as either a divided clock source or as a register for distributing the divided clock signal.

Referring now to the circuitry illustrated in FIG. 2, multiplexer ("mux") 141 is coupled to register 101 and to configuration random access memory element ("CRAM") 161 as shown. Specifically, mux 141 has an "A" input and a "B" input. Mux 141's output is coupled to the data input D of register 101. Register 101's data output Q, in addition to being coupled to inverter 132 as discussed above in reference to FIG. 1, is also coupled to the input of inverter 151. The output of inverter 151 is coupled to the A input of mux 141. CRAM 161 holds a configuration bit to select either the A input or the B input of mux 141 and the selected input is provided to the data input D of register 101. If the A input is selected, then register 101 functions as a divided clock source. However, if the B input is selected, then register 101 simply receives the inverted output from clock divider 120 as shown and described above in the context of FIG. 1. Similarly, mux 142 is coupled to register 102 and to CRAM 162 as shown. Mux 142's output is coupled to the data input D of register 102. Register 102's data output Q, in addition to being coupled to inverter 133 as discussed above in reference to FIG. 1, is also coupled to the input of inverter 152. The output of inverter 152 is coupled to the A input of mux 142. CRAM 162 holds a configuration bit to select either the A input or B input of mux 142 and the selected input is provide to the data input D of register 102. If the A input is selected, then register 102 functions as a divided clock source. However, if the B input is selected, then register 102 simply receives the inverted output from register 101 (via inverter 132) as also shown and described in the context of FIG. 1.

In one implementation, the location of the divided clock source can be configured based upon the users choice of pins for a given interface. The "DQ" pin number refers to the interface. For example, in FIG. 1 as illustrated, it is assumed that the user has chosen pins located at IO circuit group 110 to be the first pin group in the interface ("first" with reference from left to right in the drawing). Therefore, the drawing labels those pins "DQ0-DQ7." In this case, the electronic device portion 1000 can be configured such that clock divider 120 is the divided clock source. In that case, with reference to FIG. 2, configuration values would be set such that the "B" inputs of mux 141 and 142 are selected. However, if the user has chosen to utilize the pins at IO circuit group 111 to be the first pins in the interface (i.e., the physical pins labeled DQ8-DQ15 in FIG. 1 would be re-labeled as DQ0-DQ7 to reflect the new choice for the beginning of the interface) then electronic device portion 1000 can be configured such that register 101 serves as the divided clock source. In that case, with reference to FIG. 2, configuration values would be set such that the "A" input of mux 141 is selected (the "B" input of mux 142 would still be selected). Similarly, if the user has chosen to utilize the pin group associated with IO circuit group 112 as the first pins in the interface, then electronic device portion 1000 can be configured such that register 102 serves as the divided clock source. In that case, with reference to FIG. 2, configuration values would be set such that the "A" input of mux 142 is selected. One skilled in the art will appreciate how such flexibility for in selection and divided clock source location can, if desired, be provided all the way around the IO ring in similar fashion.

The manner in which the embodiment illustrated in FIG. 1 distributes a synchronous divided clock signal will now be described in further detail with reference to both FIG. 1 and FIG. 3.

Figure 3:
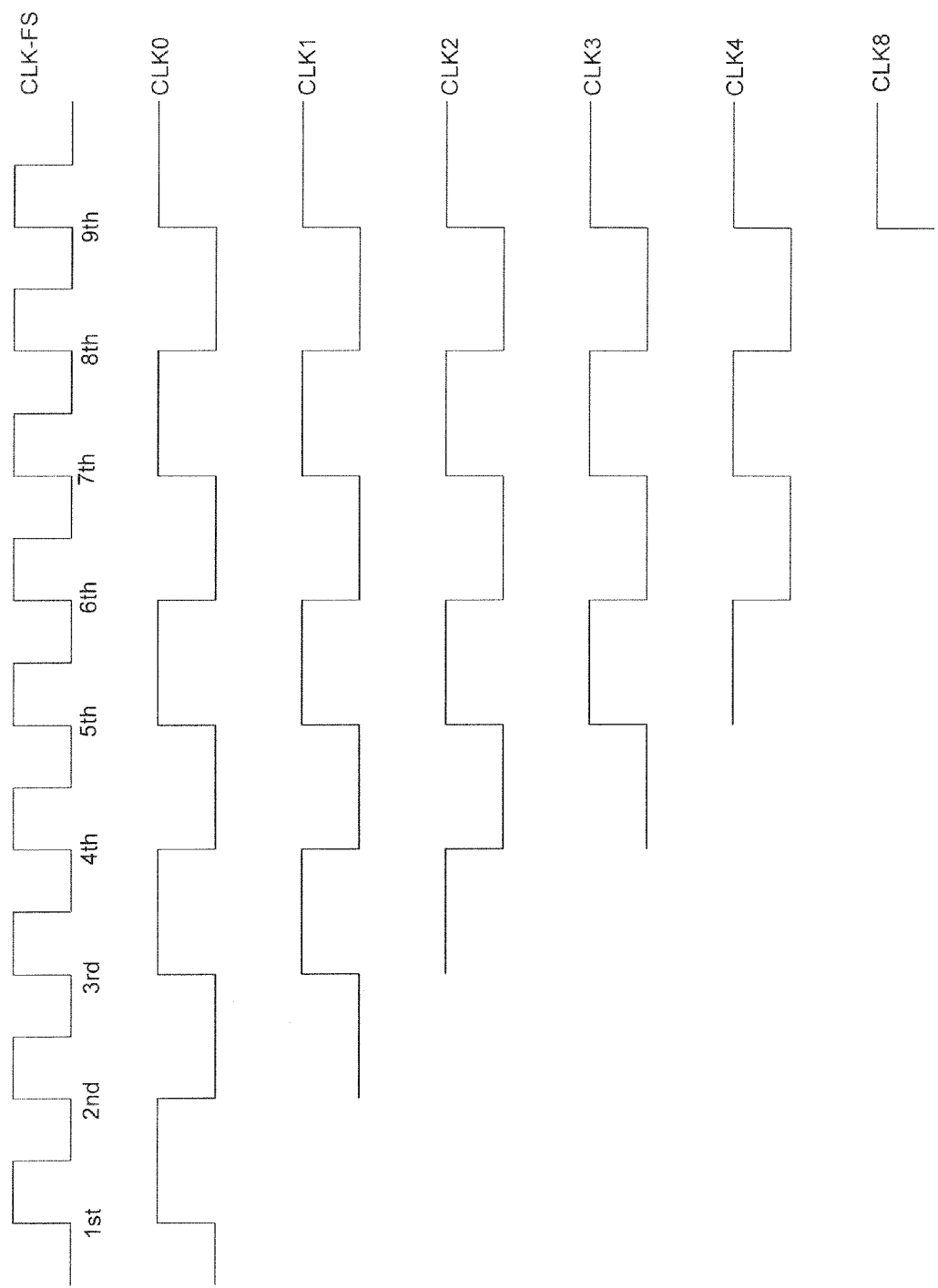
FIG. 3 illustrates various clock signals generated and distributed by the embodiment illustrated in FIG. 1.

FIG. 3 is a timing diagram illustrating initial cycles of full-speed clock signal CLK-FS and divided clock signals CLK0, CLK1, CLK2, CLK3, CLK4, and CLK8. Referring to FIG. 1, the divided clock signal is initially distributed to IO circuitry 110 as signal CLK0. From the outset, divided clock signal CLK0 is in sync with full-speed clock signal CLK-FS (but note that CLK0 has ½ the frequency of CLK-FS). CLK0 is also inverted and provided at the data input of register 101. Referring to FIG. 3 and FIG. 1, upon occurrence of the $2^{nd}$ rising edge of full-speed clock signal CLK-FS, the inverted output of divided clock source 120 (which had been provided at register 101's data input) is registered by register 101 and provided at register 101's data output as divided clock signal CLK1. At that point (i.e., after the second rising edge of CLK-FS), divided clock CLK1 is synchronized with divided clock CLK0. Also, at the same time, the output of register 101 (CLK1) is inverted and provided to the data input of the next register, register 102. Upon occurrence of the $3^{rd}$ rising edge of full-speed clock signal CLK-FS, the inverted output of register 101 (which had been provided at register 102's data input) is registered by register 102 and provided at register 102's data output as divided clock signal CLK2. At that point (i.e., after the second rising edge of CLK-FS), CLK2 is in sync with CLK1 and CLK0. This process continues step by step until synchronous divided clock signals for each IO circuit are distributed. For example, after the $4^{th}$ rising edge of CLK-FS, CLK3 is in sync with CLK0, CLK1, and CLK2. After the $5^{th}$ rising edge of CLK-FS, CLK 4 is in sync with CLK0, CLK1, CLK2, and CLK3. Assuming three additional registers in the series between register 104 and register 108 (additional registers not separately shown), CLK 8 would be in sync with the other divided clock signals after the $9^{th}$ rising edge of full-speed clock signal CLK-FS.

Thus, in the illustrated example, the initial time to distribute and synchronize all divided clock signals is equal to "n" full-speed clock cycles where "n" is the number of registers in the series utilized for carrying out the distribution and synchronization. In general, such an initial time cost on start up will be acceptable, particularly given the benefits of resource efficiency under the illustrated approach.

Figure 4:
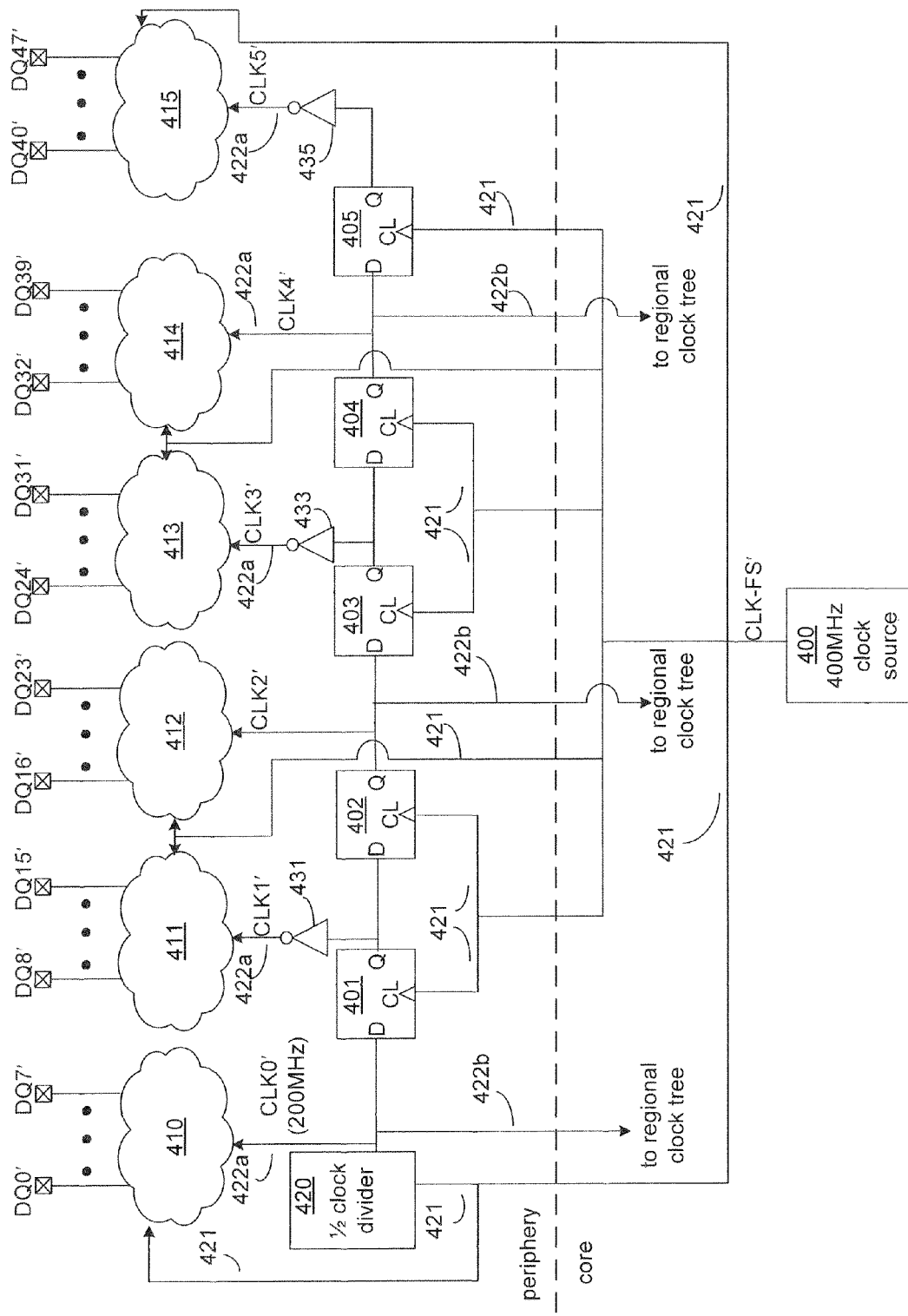
FIG. 4 illustrates an electronic device portion including a clock signal distribution network in accordance with an alternative embodiment of the present invention.

FIG. 4 illustrates an electronic device portion 4000 including clock distribution circuitry in accordance with an alternative embodiment of the present invention. The embodiment of FIG. 4 is different than the embodiment of FIG. 1 in that inverters are not placed directly on the path between the data output of one register and the data input of the next register, but instead are placed on some of the paths between a register's output and the divided clock signal distribution destinations.

Referring to the operation of the illustrated elements of portion 4000, clock source 400 generates a full-speed clock signal CLK-FS' in a core portion of the electronic device. A global clock tree comprising lines 421 distributes full-speed clock signal CLK-FS' (having a frequency of 400 MHz in this example) to IO circuits 410, 411, 412, 413, 414, and 415, to clock divider 420, and to the clock inputs of registers in a series of registers including registers 401, 402, 403, 404, and 405.

Clock divider 420 is a "divide-by-two" clock divider and it derives a divided clock signal CLK0' (having a frequency of 200 MHz in this example). Divided clock signal CLK0' is provided to IO circuitry 410 via a line 422a as shown. Signal CLK0' is also provided to a data input of register 401. Register 401 is a first register in a series of registers distributing the divided clock signal from divided clock signal source 420. Register 401's data output is provided to inverter 431 which inverts the output to provide clock signal CLK1' via a line 422a to IO circuitry 411. Register 401's output is also provided to the data input of register 402, the next succeeding register in the series of registers. Register 402's output is provided as clock signal CLK2' (without being inverted) via a line 422a to IO circuitry 412 and register 402's output is also provided to the data input of register 403, the next succeeding register in the series of registers. Register 403's data output is provided to inverter 433 which inverts the output to provide clock signal CLK3' via a line 422a to IO circuitry 413. Register 403's output is also provided to the data input of register 404, the next succeeding register in the series of registers. Register 404's output is provided as CLK4' (without being inverted) to IO circuitry 414 and it is also provided to the data input of register 405. Register 405's output is provided to inverter 435 which inverts the output to provide clock signal CLK5' via a line 422a to IO circuitry 415.

Each IO circuit includes some elements (not separately shown) clocked at the speed of full-speed clock signal CLK-FS' and some elements (not separately shown), clocked at the speed of a divided clock signal that has ½ the frequency of CLK-FS'. Therefore, as shown, both full-speed clock signal CLK-FS', and a divided clock signal is distributed to each IO circuit. Specifically, CLK-FS' is distributed over lines 421 to each of IO circuitry 410, 411, 412, 413, 414, and 415 which each also receive a divided clock signal via lines 422a (respectively, divided clocks CLK0', CLK1', CLK2', CLK3', CLK4', and CLK5').

In the illustrated example, additional lines, lines 422b, are provided to distribute divided clock signals to regional clock trees for distribution to the core. For purposes of not over-complicating the drawings, this distribution of the divided clock signals to core clock trees is only shown with respect to the outputs of clock divider 420, register 402, and register 404. Note, however, that to the extent such output is provided from one of the odd numbered registers (i.e., 401, 403, and 405), it would need to pass through an inverter before being distributed to core regional clock trees in order to be in sync with the other divided clock signals (just as, for example, the output of registers 401, 403, and 405 are inverted prior to being distributed to IO circuits 411, 413, and 415.

For ease of illustration, portion 4000 shows circuitry distributing a divided clock signal across IO circuits corresponding to a 48-pin interface (i.e., pins DQ0'-DQ47'). In alternative embodiments, a divided clock signal from a single divided clock signal source such as source 420 can be distributed over a smaller or larger number of IO circuits using the illustrated approach.

The embodiment illustrated in FIG. 4 could be modified so that any register may be selected as the divided clock source using circuitry such as that shown in FIG. 2. In such an implementation, further modifications to the illustrated embodiment may also be provided to preserve the same level of flexibility discussed in reference to the embodiment illustrated in FIGS. 1 and 2. For example, referring to FIG. 4, in order to provide the same sequence of alternating non-inverted and inverted pathways (beginning with the output of the divided clock source—which is not inverted before reaching IO circuitry 410—and continuing with register 401's output—which is inverted before reaching IO circuitry 411, etc.) relative to the location of the divided clock source, irrespective of where that divided clock source is located, the illustrated embodiment could be modified to provide both non-inverted and inverted pathways from the output of each register to the corresponding divided clock destination circuitry. The choice of pathways could be programmably selectable. For example, if register 401 were used as the divided clock source, then a non-inverted pathway from register 401's output to IO circuitry 411 would be selected and an inverted pathway from register 402's output to IO circuitry 412 would be selected.

Figure 5:
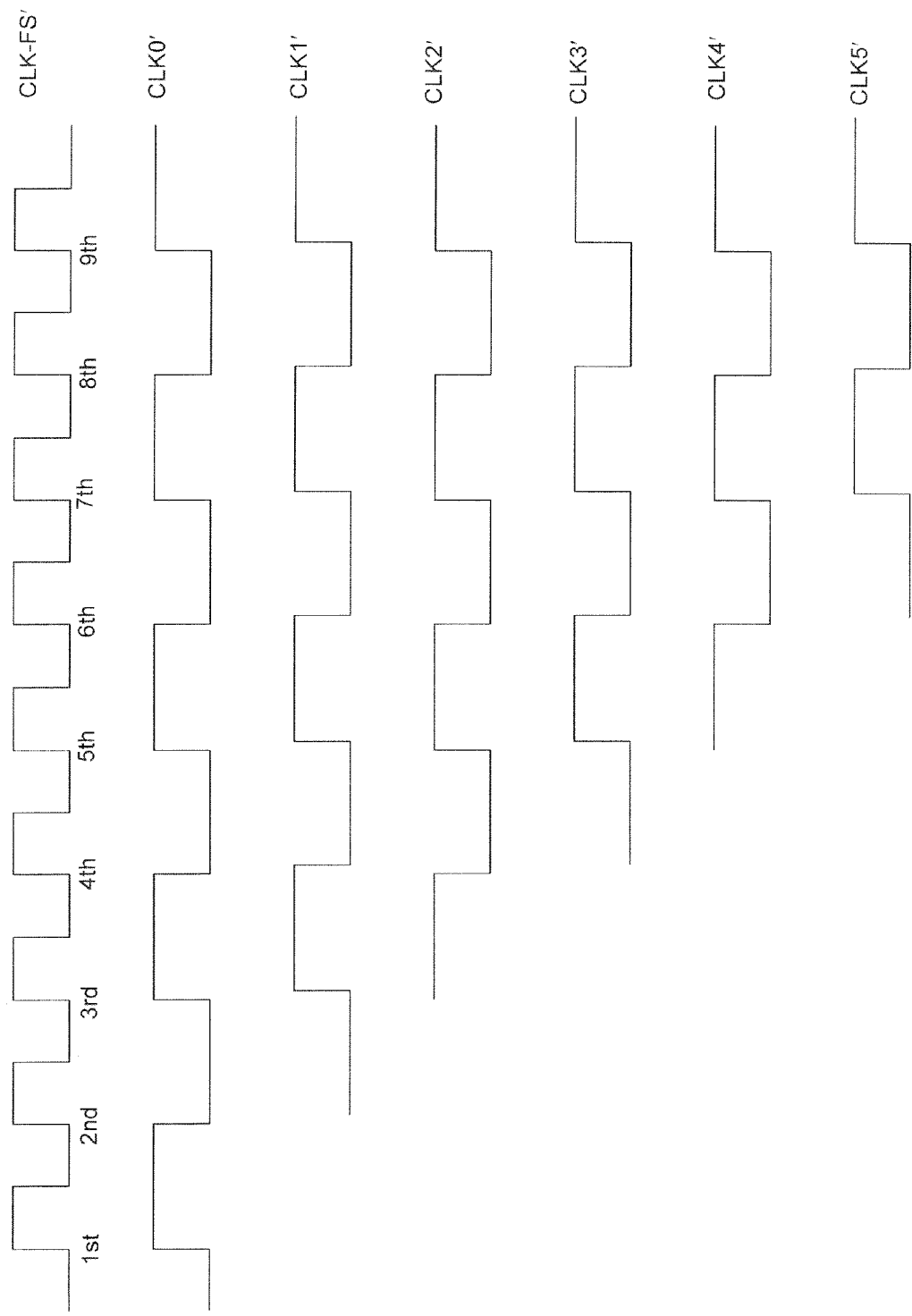
FIG. 5 illustrates various clock signals generated and distributed by the embodiment illustrated in FIG. 4.

FIG. 5 is a timing diagram illustrating initial cycles of full-speed clock signal CLK-FS' and divided clock signals CLK0', CLK1', CLK2', CLK3', CLK4', and CLK5'. One skilled in the art will appreciate that, given the structures illustrated in FIG. 4, divided clock signals CLK1', CLK3', and CLK5' will be slightly delayed relative to CLK0', CLK2', and CLK4'. This delay reflects the fact that signals CLK1', CLK3', and CLK5' are on pathways that include an inverter between the relevant register output and the corresponding divided clock signal destination circuitry whereas signals CLK0', CLK2', and CLK4' travel on pathways that do not include such inverters. For most applications, this delay will be small enough to be acceptable and divided clock signals CLK0', CLK1', CLK2', CLK3', CLK4', and CLK5' can all be said to be "in sync" for purposes of most applications. However, one skilled in the art will appreciate that such relative delay can be minimized, if necessary, by various methods such as, for example, increasing the length of the non-inverted pathways to compensate for the delay on the inverted pathways.

As shown in FIG. 5, the divided clock signals are synchronized and delivered step-by-step on each rising edge of full speed clock signal CLK-FS'. Divided clock signal CLK0' is considered to be synchronized from the outset. CLK1' is synchronized after the $2^{nd}$ rising edge of CLK-FS', CLK2' after the $3^{rd}$ rising edge of CLK-FS', CLK3' after the $4^{th}$ rising edge of CLK-FS', CLK4' after the $5^{th}$ rising edge of CLK-FS', and CLK5' after the $6^{th}$ rising edge of CLK-FS'.

Figure 6:
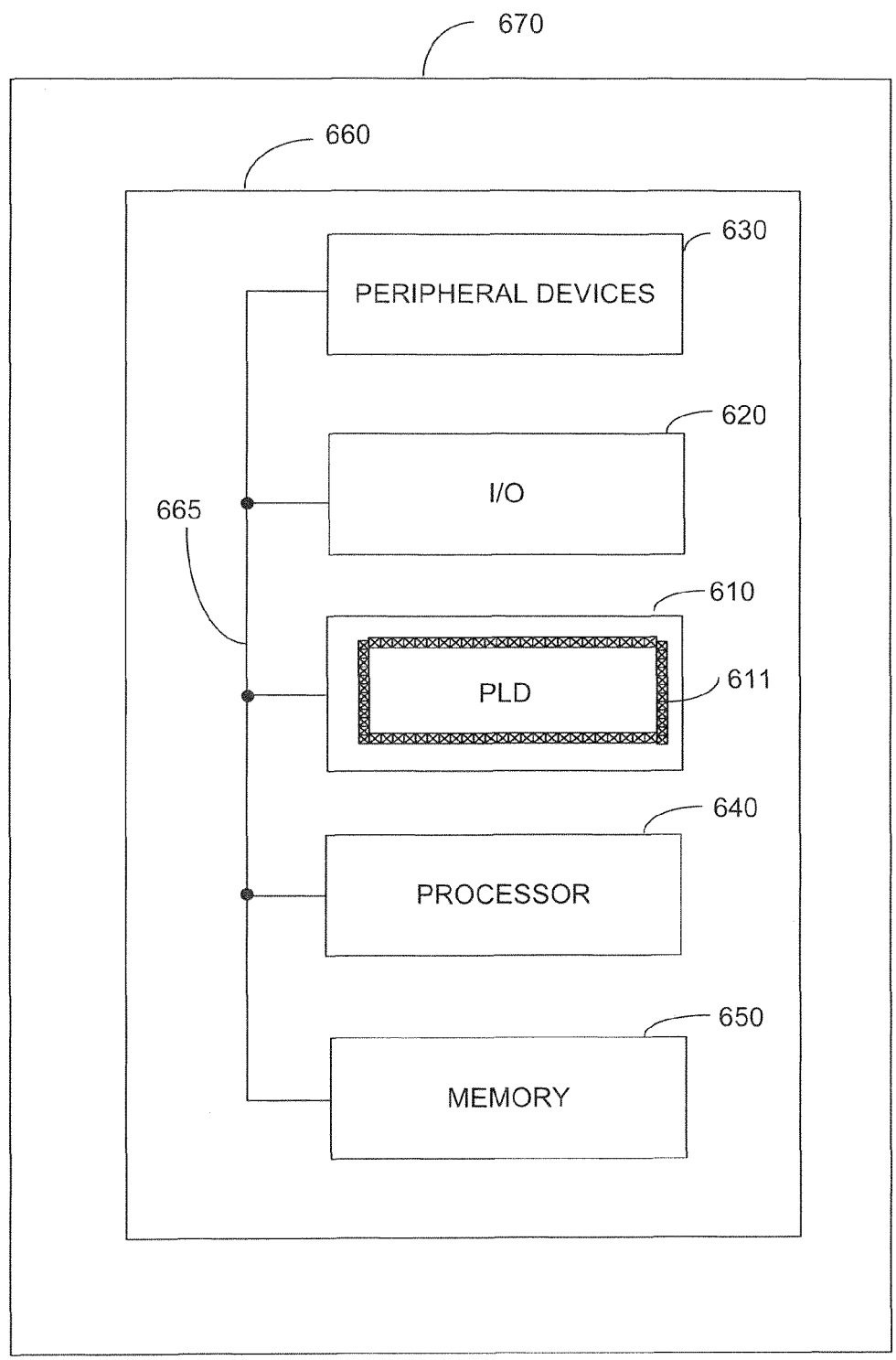
FIG. 6 illustrates a programmable logic device including a clock distribution network in accordance with an embodiment of the present invention implemented in a data processing system.

FIG. 6 illustrates a PLD 610 including clock distribution circuitry 611 in accordance with an embodiment of the present invention. Programmable logic devices ("PLDs") (also sometimes referred to as complex PLDs ("CPLDs"), programmable array logic ("PALs"), programmable logic arrays ("PLAs"), field PLAs ("FPLAs"), erasable PLDs ("EPLDs"), electrically erasable PLDs ("EEPLDs"), logic cell arrays ("LCAs"), field programmable gate arrays ("FPGAs"), or by other names) are well known ICs that provide the advantages of fixed ICs with the flexibility of custom ICs. Such devices are well known in the art and typically provide an "off the shelf" device having at least a portion that can be programmed to meet a user's specific needs. Application specific ICs ("ASICs") have traditionally been fixed ICs, however, it is possible to provide an ASIC that has a portion or portions that are programmable; thus, it is possible for an IC device to have qualities of both an ASIC and a PLD. The term PLD as used herein will be considered broad enough to include such devices.

PLDs typically include blocks of logic elements, sometimes referred to as logic array blocks ("LABs"; also referred to by other names, e.g., "configurable logic blocks," or "CLBs"). Logic elements ("LEs", also referred to by other names, e.g., "logic cells") may include a look-up table ("LUT") or product term, carry-out chain, register, and other elements. LABs (comprising multiple LEs) may be connected to horizontal and vertical lines that may or may not extend the length of the PLD.

PLDs have configuration elements that may be programmed or reprogrammed. Configuration elements may be realized as random access memory ("RAM") bits, flip-flops, electronically erasable programmable read-only memory ("EEPROM"), or other memory elements. Placing new data into the configuration elements programs or reprograms the PLD's logic functions and associated routing pathways. Configuration elements that are field programmable are often implemented as RAM cells (sometimes referred to as "CRAM" or "configuration RAM"). However, many types of configurable elements may be used including static or dynamic random access memory, electrically erasable read-only memory, flash, fuse, and anti-fuse programmable connections. The programming of configuration elements could also be implemented through mask programming during fabrication of the device. While mask programming may have disadvantages relative to some of the field programmable options already listed, it may be useful in certain high volume applications.

FIG. 6 further illustrates PLD 610 implemented in a data processing system 600. Data processing system 600 may include one or more of the following components: a processor 640; memory 650; I/O circuitry 620; and peripheral devices 630. These components are coupled together by a system bus 665 and are populated on a circuit board 660 which is contained in an end-user system 670. A data processing system such as system 600 may include a single end-user system such as end-user system 670 or may include a plurality of systems working together as a data processing system.

System 600 can be used in a wide variety of applications, such as computer networking, data networking, instrumentation, video processing, digital signal processing, or any other application where the advantage of using programmable or reprogrammable logic in system design is desirable. PLD 610 can be used to perform a variety of different logic functions. For example, PLD 610 can be configured as a processor or controller that works in cooperation with processor 640 (or, in alternative embodiments, a PLD might itself act as the sole system processor). PLD 610 may also be used as an arbiter for arbitrating access to shared resources in system 600. In yet another example, PLD 610 can be configured as an interface between processor 640 and one of the other components in system 600. It should be noted that system 600 is only exemplary.

In one embodiment, system 600 is a digital system. As used herein a digital system is not intended to be limited to a purely digital system, but also encompasses hybrid systems that include both digital and analog subsystems.

Although particular embodiments have been described in detail and certain variants have been noted, various other modifications to the embodiments described herein may be made without departing from the spirit and scope of the present invention, thus, the invention is limited only by the appended claims.

What is claimed is:

1. A method of distributing a clock signal comprising:
   dividing a full-speed clock signal to provide a divided clock signal having a smaller frequency than the full-speed clock signal; and
   distributing the divided clock signal to a plurality of destination circuits through a series of registers clocked by the full-speed clock signal such that the divided clock signal is provided to each of the plurality of destination circuits from output of a different register in the series of registers;
   wherein a first register in the series receives the divided clock signal inverted and each succeeding register in the series receives inverted output from a prior register in the series.

2. A method of distributing a clock signal comprising:
   dividing a full-speed clock signal to provide a divided clock signal having a smaller frequency than the full-speed clock signal; and
   distributing the divided clock signal to a plurality of destination circuits through a series of registers clocked by the full-speed clock signal such that the divided clock signal is provided to each of the plurality of destination circuits from output of a different register in the series of registers;
   wherein distributing further comprises:
   beginning with a first register in the series, inverting output of alternating registers of the series and distributing the inverted output to certain destination circuits of the plurality of destination circuits.

3. The method of claim 2 wherein distributing further comprises:
   beginning with a second register in the series, distributing non-inverted output of alternating registers in the series to certain other destination circuits of the plurality of destination circuits.

4. The method of claim 1 further comprising:
   distributing the divided clock signal and the full-speed clock signal to IO circuitry in a periphery of an electronic device.

5. The method of claim 1 further comprising distributing the divided clock signal to core regions of the electronic device, the core regions of the electronic device operating at a slower clock speed than a clock speed of a data interface with which the device is interacting.

6. The method of claim 2 further comprising:
   distributing the divided clock signal and the full-speed clock signal to IO circuitry in a periphery of an electronic device.

7. The method of claim 2 further comprising distributing the divided clock signal to core regions of the electronic device, the core regions of the electronic device operating at a slower clock speed than a clock speed of a data interface with which the device is interacting.

* * * * *